(12) United States Patent
Tsukamizu et al.

(10) Patent No.: US 6,243,845 B1
(45) Date of Patent: Jun. 5, 2001

(54) CODE ERROR CORRECTING AND DETECTING APPARATUS

(75) Inventors: Yuichiro Tsukamizu; Shinichiro Tomisawa, both of Gifu-ken (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/098,095

(22) Filed: Jun. 16, 1998

(30) Foreign Application Priority Data

Jun. 19, 1997 (JP) .................................................... 9-162793
Jun. 19, 1997 (JP) .................................................... 9-162794

(51) Int. Cl.[7] ............................ G11C 29/00; H03M 13/00
(52) U.S. Cl. ........................................... 714/769; 714/752
(58) Field of Search ................................. 714/769, 752, 714/755, 758, 756

(56) References Cited

U.S. PATENT DOCUMENTS

| | | | |
|---|---|---|---|
| 5,408,478 | * | 4/1995 | Ohmori et al. ...................... 371/37.5 |
| 5,410,554 | * | 4/1995 | Watanabe ............................ 371/40.1 |
| 5,412,667 | * | 5/1995 | Havemose ........................... 371/37.5 |
| 5,499,252 | * | 3/1996 | Watanabe ............................ 371/40.1 |
| 5,535,327 | * | 7/1996 | Verinsky et al. ................. 395/182.03 |
| 5,592,450 | * | 1/1997 | Yonemitsu et al. .................... 369/48 |
| 5,623,623 | * | 4/1997 | Kim et al. ........................... 395/430 |
| 5,666,336 | * | 9/1997 | Yoshida ................................. 369/32 |
| 5,696,774 | * | 12/1997 | Inoue et al. ......................... 371/37.4 |
| 5,740,143 | * | 4/1998 | Suetomi ................................. 369/60 |
| 5,818,801 | * | 10/1998 | Watanabe et al. ...................... 369/33 |
| 5,831,955 | * | 11/1998 | Arataki et al. ......................... 369/59 |
| 5,864,568 | * | 1/1999 | Nemazie ............................ 371/40.14 |
| 5,920,578 | * | 7/1999 | Zook .................................... 371/37.4 |
| 5,988,872 | * | 11/1999 | Jeong ................................ 371/40.14 |
| 6,003,151 | * | 12/1999 | Chuang ................................. 714/752 |
| 6,004,028 | * | 12/1999 | Bottomley ............................ 714/758 |
| 6,058,499 | * | 5/2000 | Sim ..................................... 714/755 |

* cited by examiner

Primary Examiner—Albert DeCady
Assistant Examiner—Samuel Lin
(74) Attorney, Agent, or Firm—Sheridan Ross P.C.

(57) ABSTRACT

An error correcting and detecting apparatus for a CD-ROM or DVD system executes a high speed decode process. The apparatus includes an input interface, a temporary memory, a correcting circuit, a detecting circuit, a principal memory, and an output interface. The input interface fetches digital data in a block by block manner. The temporary memory stores the fetched digital data in a block by block manner. The correcting circuit performs error correction on digital data read from the temporary memory in a block by block manner using the error correction code and rewrites erroneous digital data to the temporary memory with the corrected digital data. The detecting circuit performs error detection on the error corrected digital data and supplied from the temporary memory in a block by block manner using the error detection code and sets an error flag based on a detection result. The principal memory stores, in a block by block manner, the error corrected digital data supplied to the detecting circuit from the temporary memory. The output interface transfers the error corrected digital data stored in the principal memory to an external unit.

10 Claims, 6 Drawing Sheets

|    | 0    | 1    | 2    | ·    | ·    | ·    | 41   | 42   |           |
|----|------|------|------|------|------|------|------|------|-----------|
| 0  | 0000 | 0001 | 0002 | .... | .... | .... | 0041 | 0042 |           |
| 1  | 0043 | 0044 | 0045 | .... | .... | .... | 0084 | 0085 |           |
| 2  | 0086 | 0087 | 0088 | .... | .... |      | 0127 | 0128 |           |
| 3  | 0129 | 0130 | 0131 | .... |      |      |      | 0171 | Header    |
| 4  | 0172 | 0173 | .... |      | Q sequence |  |      | 0214 | User data |
| ·  |      |      |      |      |      |      |      | ·    | EDC       |
| ·  | P sequence |  |      |      |      |      |      | ·    | Space     |
| ·  |      |      |      |      |      |      |      | ·    |           |
| 22 | 0946 | 0947 | 0948 | .... | .... | .... | 0987 | 0988 |           |
| 23 | 0989 | 0990 | 0991 | .... | .... | .... | 1030 | 1031 |           |
| 24 | 1032 | 1033 | 1034 | .... | .... | 1072 | 1073 | 1074 | P code    |
| 25 | 1075 | 1076 | 1077 | .... | .... | 1115 | 1116 | 1117 | word      |
| 26 | 1118 | 1119 | 1120 | .... | 1143 |      |      |      | Q code    |
| 27 | 1144 | 1145 | 0046 | .... | 1169 |      |      |      | word      |
|    | 0    | 1    | 2    | ·    | 25   |      |      |      |           |

CODE ERROR CORRECTING AND DETECTING APPARATUS

BACKGROUND OF THE INVENTION

The present invention relates to a code error correcting and detecting apparatus and, more particularly, to a code error correcting and detecting apparatus that performs predetermined processes on digital data read from a recording medium, such as a CD (Compact Disc) or a DVD (Digital Video Disc).

In compact disc read only memory (CD-ROM) systems, a digital audio compact disc (CD) functions as a read only memory (ROM) for digital data. To improve the reliability of digital data read from the CD, error correction is performed twice on the digital data. The first error correction is executed by a digital signal processor which is common to both an audio system and a CD-ROM system, and the second error correction is executed by a CD-ROM decoder of the CD-ROM system.

FIG. 1 is a block diagram of a CD-ROM system. The CD-ROM system includes a pickup 1, a pickup controller 3, an analog signal processor 4, a digital signal processor 5, a CD-ROM decoder 6, a buffer random access memory (RAM) 7 and a control microcomputer 8.

The pickup 1 irradiates light on a disk 2 to generate a voltage signal proportional to the intensity of the reflected light. The pickup controller 3 controls the read position of the pickup 1 with respect to the disk 2 so that the pickup 1 reads data from the disk 2 in the correct order. Servo control to turn the disk 2 at a predetermined velocity is performed in accordance with the position control of the pickup 1. The servo control keeps constant the linear velocity of tracks on the disk 2.

The analog signal processor 4 receives the voltage signal from the pickup 1 and generates one frame of an Eight to Fourteen Modulation (EFM) data signal consisting of 588 bits. As shown in FIG. 2, EFM data includes a 24-bit sync signal assigned to the beginning of each frame, 3-bit connection bit fields and 14-bit data bit fields which are alternately provided in each frame after the sync signal.

The digital signal processor 5 receives the EFM signal from the analog signal processor 4 and performs EFM demodulation on the signal for conversion to 8 bits from 14 bits. In this EFM demodulation, 8-bit subcode data is produced from the first data bit field following the sync signal, and 32-byte symbol data is produced from the remaining thirty-two pieces of data bit fields. Further, the 32-byte symbol data is subjected to Cross-Interleave Reed-Solomon Code (CIRC) demodulation to yield one frame of CD-ROM data consisting of 24 bytes. The first error correcting process is completed with this CIRC demodulation.

The CD-ROM data is handled in a block by block manner, each block of data consisting of 2352 bytes (24 bytes×98 frames). As shown in FIG. 3, normally (in mode 1), one block of data includes a sync signal (12 bytes), a header (4 bytes), user data (2048 bytes), an error detection code (EDC) (4 bytes) and an error correction code (ECC) (276 bytes). In one block of data, 2340 bytes of data excluding the 12-byte sync signal has previously undergone a scrambling process and is reproduced by a descrambling process.

The CD-ROM decoder 6 receives the CD-ROM data from the digital signal processor 5 and performs error correction in accordance with the ECC and error detection in accordance with the EDC to provide the processed CD-ROM data to a host computer. Normally, therefore, after an error in data is corrected in accordance with the ECC, it is checked in accordance with the EDC to determine if the error was properly corrected. When the error has not been corrected properly, error correction is carried out again in accordance with the ECC, or an error flag is affixed to the CD-ROM data containing the error code.

The buffer RAM 7 is connected to the CD-ROM decoder 6 and temporarily stores CD-ROM data in a block by block manner. Since the ECC and EDC are included in one block of CD-ROM data, the CD-ROM decoder 6 requires at least one block of CD-ROM data. Therefore, the buffer RAM 7 stores one block of CD-ROM data for the CD-ROM decoder 6.

The control microcomputer 8 can be a one-chip microcomputer that incorporates an internal ROM and an internal RAM. The control microcomputer 8 controls the operation of the CD-ROM decoder 6 in accordance with a control program stored in the ROM. At the same time, the control microcomputer 8 receives command data from the host computer and subcode data from the digital signal processor 5 and temporarily stores those data in its internal RAM. The control microcomputer 8 controls the operations of the individual circuits in accordance with the command data (i.e., commands from the host computer) so that the host computer can receive the desired CD-ROM data from the CD-ROM decoder 6.

The CD-ROM decoder 6 receives the CD-ROM data from the digital signal processor 5 and sends the CD-ROM data to the host computer in parallel. In accordance with the input and output of data, writing and reading the CD-ROM data into and from the buffer RAM 7 are repeated. Normally, the CD-ROM decoder 6, in a time-sharing manner, accesses the buffer RAM 7 in units of bytes or codes for each input or output.

In general, the CD-ROM decoder 6 is configured such that error correction and detection for one block of CD-ROM data is completed within a predetermined period (hereinafter called "one block period") in accordance with a reference system clock. If a predetermined process cannot be accomplished within one block period for some reason, CD-ROM data is consecutively written in the buffer RAM 7. As a result, unprocessed CD-ROM data remains in the buffer RAM 7. As such a state continues, the buffer RAM 7 overflows. This overflow forces the CD-ROM decoder 6 to temporarily interrupt the reception of CD-ROM data.

For fast reproduction like ×2 reproduction, the CD-ROM system increases the playback speed of the disk 2 without changing the frequency of the reference system clock supplied to each circuit. The increased playback speed decreases the number of clock cycles supplied in one block period. In other words, the duration of one block period for error correction and detection is shortened and becomes insufficient to find and correct errors, and to process the CD-ROM data. The reduction in the number of clock cycles makes it difficult to complete a predetermined process in one block period.

For fast transfer of CD-ROM data to the host computer, the frequency of data reading from the buffer RAM 7 can be increased. However, when such fast transfer is provided, the time available for reading and writing CD-ROM data from and into the buffer RAM 7 decreases. As a result, the error correction and detection process is often delayed, thus making it difficult to accomplish a predetermined process in one block period.

The above-mentioned problems also arise in a digital video disc read only memory (DVD-ROM) system which uses a DVD or a high-density recording medium as a ROM. A DVD has approximately seven times the recording capacity of a CD. Therefore, there is an even greater demand for a faster playback speed in a DVD-ROM system than for a CD-ROM system.

It is an object of the present invention to provide an error correcting and detecting decoder that executes a decode process at high speed.

SUMMARY OF THE INVENTION

Briefly stated, the present invention provides a code error correcting and detecting apparatus which performs error correction and error detection on plural blocks of digital data using an error correction code and an error detection code to generate processed digital data. The apparatus includes an input interface, a temporary memory, a correcting circuit, a detecting circuit, a principal memory, and an output interface. The input interface fetches digital data in a block by block manner. The internal memory stores the fetched digital data in a block by block manner. The correcting circuit performs error correction on digital data read from the internal memory in a block by block manner using the error correction code and rewrites erroneous digital data to the internal memory with the corrected digital data. The detecting circuit performs error detection on the error corrected digital data and supplied from the internal memory in a block by block manner using the error detection code and sets an error flag based on a detection result. The principal memory stores, in a block by block manner, the error corrected digital data supplied to the detecting circuit from the internal memory. The output interface transfers the error corrected digital data stored in the principal memory to an external unit.

The present invention also provides a code error correcting and detecting apparatus which performs error correction and error detection on plural blocks of digital data using an error correction code and an error detection code to generate processed digital data. The apparatus includes an input interface, a temporary memory, a principal memory, a correcting circuit, a detecting circuit, and an output interface. The input interface fetches digital data in a block by block manner. The internal memory stores the fetched digital data in a block by block manner. The principal memory stores digital data in a block by block manner together with the internal memory. The correcting circuit performs error correction on digital data read from the internal memory in a block by block manner using the error correction code and rewrites erroneous digital data to the internal memory and the principal memory with correct digital data. The detecting circuit performs error detection on the error corrected digital data supplied from the internal memory in a block by block manner using the error detection code and sets an error flag based on a detection result. The output interface transfers the error corrected digital data stored in the principal memory to an external unit.

The present invention can be implemented in numerous ways including as an apparatus, a system and a method.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
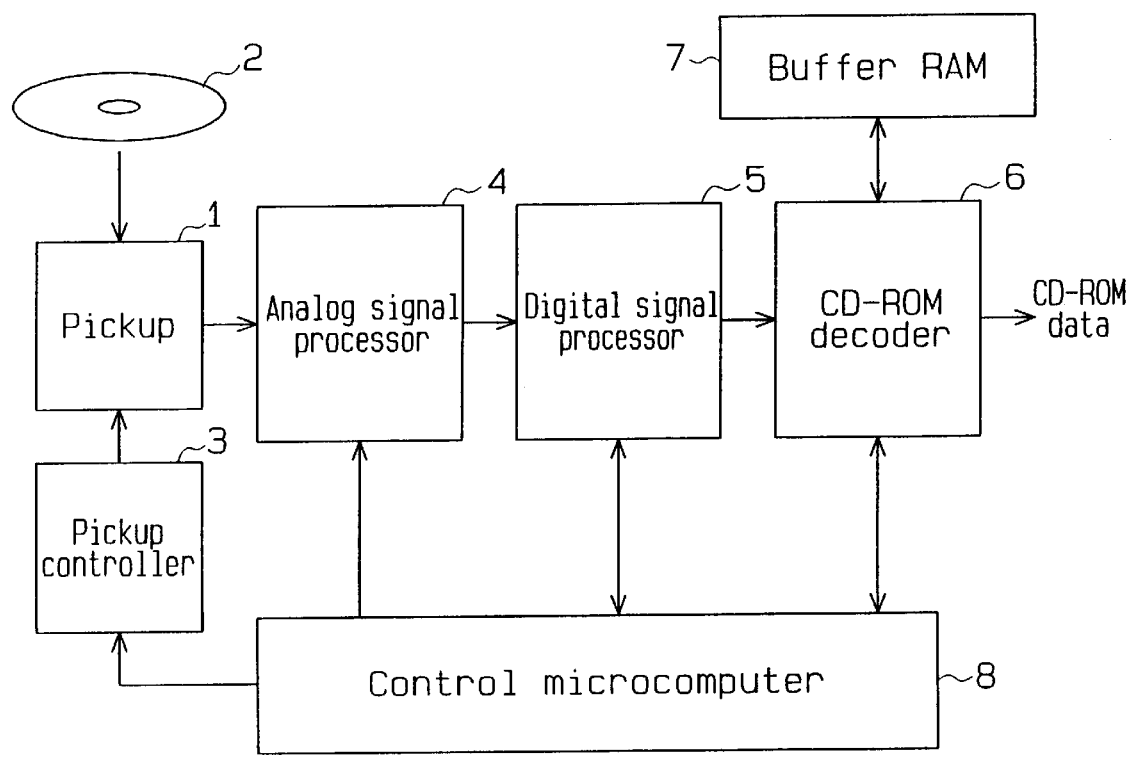
FIG. 1 is a schematic block diagram of a conventional CD-ROM system.
Figure 2:
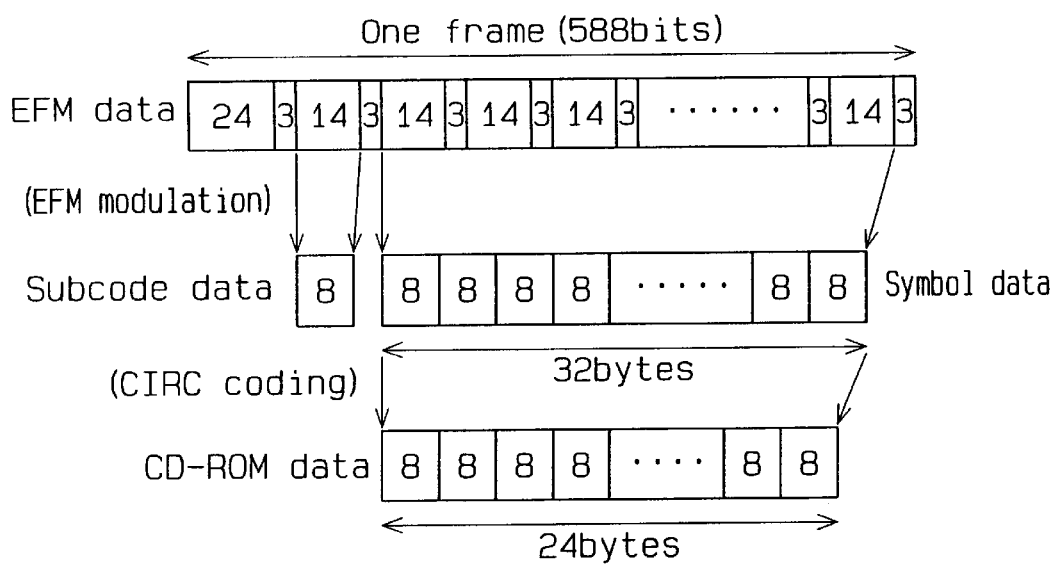
FIG. 2 shows the format of data read from a disk by the system in FIG. 1.
Figure 3:
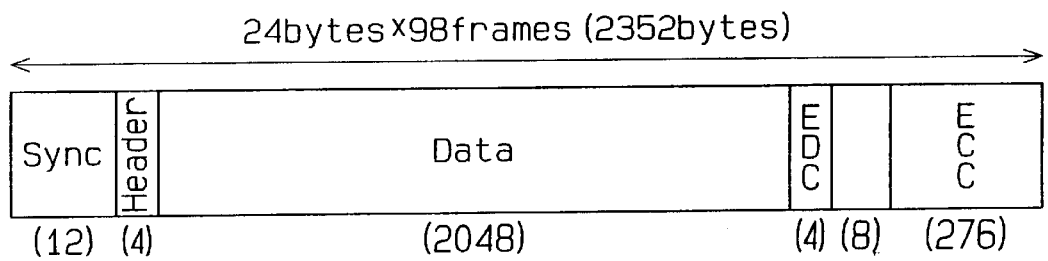
FIG. 3 shows the format of CD-ROM data generated by the system in FIG. 1.
Figure 4:
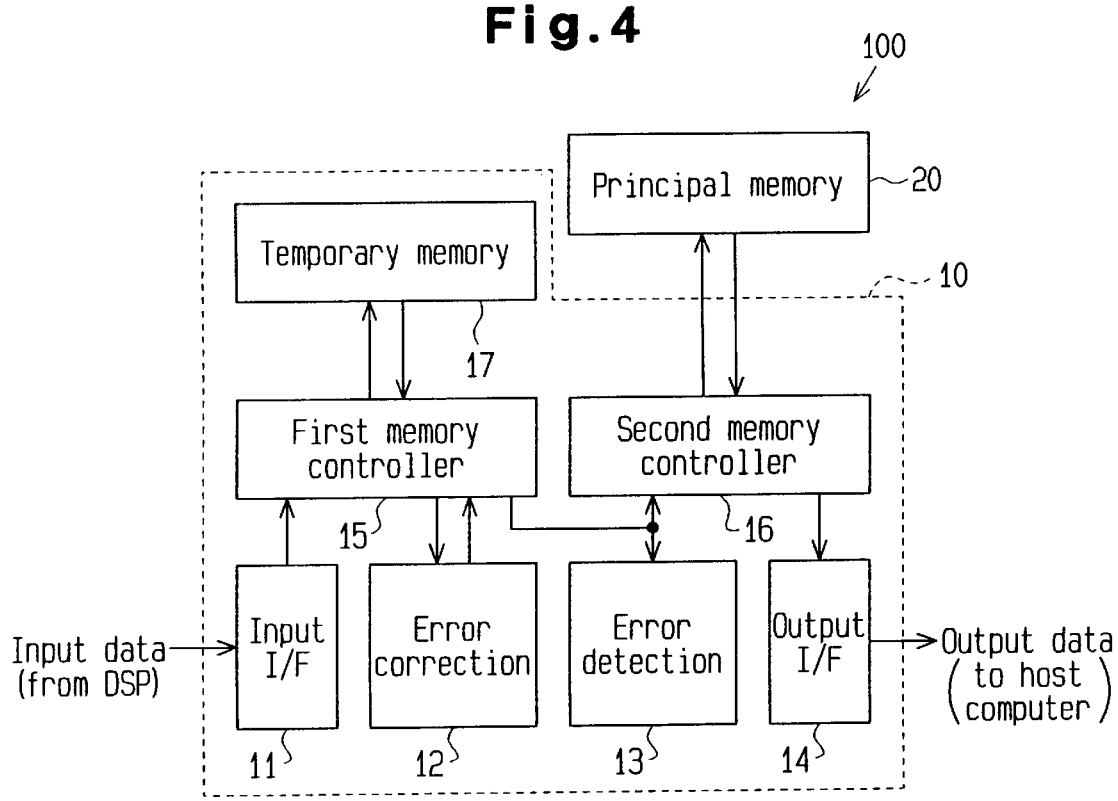
FIG. 4 is a schematic block diagram of a code error correcting and detecting apparatus according to a first embodiment of the present invention.

FIG. 4 is a schematic block diagram of a code error correcting and detecting apparatus 100 according to a first embodiment of the present invention. The code error correcting and detecting apparatus 100 has a CD-ROM decoder 10 and a principal memory (buffer RAM) 20. The CD-ROM decoder 10 includes an input interface 11, an error correcting circuit 12, an error detecting circuit 13, an output interface 14, a first memory controller 15, a second memory controller 16 and a temporary memory 17, all integrated on a single semiconductor substrate. In this embodiment, the temporary memory 17 is provided in the CD-ROM decoder 10, and the principal memory 20 is provided outside the CD-ROM decoder. Alternatively, both the temporary memory 17 and the principal memory 20 may be provided in the CD-ROM decoder 10.

The input interface 11 receives CD-ROM data (one block of CD-ROM data consists of 2352 bytes) generated by a digital signal processor (DSP), extracts a sync signal of 12 bytes from the CD-ROM data and generates a block sync signal which indicates the head of each block. The block sync signal is supplied to the individual components of the CD-ROM decoder 10. The input interface 11 descrambles 2340-byte CD-ROM data excluding the sync signal and supplies the descrambled data to the internal memory controller 15.

The error correcting circuit 12 receives CD-ROM data block by block, and performs code error correction using an error correction code (ECC). In the code error correction, one block (2352 bytes) of data is separated into an upper-byte plane (1176 bytes) and a lower-byte plane (1176 bytes). Then, syndrome computation is executed using code words (P and Q) of two systems that are set for the respective planes.

Figures 6, 7:
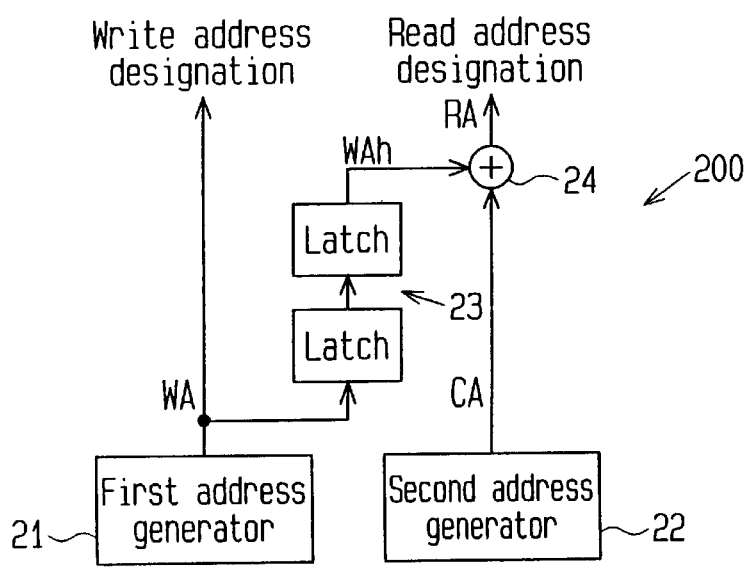
FIG. 6 shows the constitution and access order of CD-ROM data in an error correcting process performed by the apparatus in FIG. 4.
FIG. 7 is a schematic block diagram of an address generating circuit in accordance with the present invention.

The P code words and Q code words comprise 1032 pieces of symbol data in one plane excluding the sync signal and ECC as shown in FIG. 6. In the symbol data, two P code words are assigned to each 24 pieces of symbol data with respect to the P sequence and two Q code words are assigned to each 43 pieces of symbol data with respect to the Q sequence. Accordingly, 86 P code words are assigned for 43 sets of symbol data, and 52 Q code words for 26 sets of symbol data (including P code words). Syndrome computation is performed on the symbol data including the individual code words in the order of the P sequence and Q sequence. This computation yields the position and value of a code error in a plane. The error correcting circuit 12 corrects the code error by adding an error value to the symbol data that is located at the error position.

The error detecting circuit 13 receives code-error corrected CD-ROM data (excluding the ECC) block by block, and carries out computation using an error detection code (EDC) to detect if a code error is present. Since an error cannot be corrected by using the EDC, an error flag is affixed to the CD-ROM data when the error detecting circuit 13 detects an error.

The output interface 14 sends the CD-ROM data, which has undergone a predetermined process, to a host computer block by block in response to an instruction from the host computer. The output interface 14 receives from the host computer control information for controlling the operations of the individual components as needed, and supplies the control information to a control microcomputer.

The internal memory controller 15, connected between the internal memory 17 and the input interface 11, the error correcting circuit 12 and the error detecting circuit 13, controls writing of CD-ROM data in the internal memory 17 from the input interface 11, and transfer of CD-ROM data to the error correcting circuit 12 or the error detecting circuit 13 from the internal memory 17. Based on the result of correction by the error correcting circuit 12, the internal memory controller 15 rewrites part of CD-ROM data stored in the internal memory 17. Specifically, when the position of a code error is computed by the error correcting circuit 12, an address in the internal memory 17 where data corresponding to the error position is stored is accessed, and this data is transferred to the error correcting circuit 12 from the internal memory 17. After error correction is completed, corrected data is written at the same address in the internal memory 17 to rewrite the data in the internal memory 17.

The second memory controller 16, connected between the principal memory 20 and the internal memory controller 15, the error detecting circuit 13 and the output interface 14, controls writing of CD-ROM data in the principal memory 20 from the internal memory controller 15, and transfer of CD-ROM data to the output interface 14 from the principal memory 20. Accordingly, transfer of CD-ROM data to the error detecting circuit 13 from the internal memory 17 by the internal memory controller 15 and writing of CD-ROM data from the internal memory controller 15 into the principal memory 20 by the second memory controller 16 are carried out in parallel.

The internal memory 17, which is a readable and writeable recording medium like an SRAM (Static Random Access Memory), temporarily stores CD-ROM data which is supplied from the input interface 11 via the internal memory controller 15. The internal memory 17 should preferably have a capacity large enough to store at least two blocks of CD-ROM data. As one block of CD-ROM data in the ordinary format comprises of 2352 bytes, a capacity of 4.8 Kbytes or more is needed.

The principal memory 20, which is a readable and writeable recording medium, temporarily stores CD-ROM data which is transferred to the host computer via the output interface 14. The principal memory 20 should preferably have a capacity large enough to store at least two blocks of CD-ROM data. It is more preferable that the principal memory 20 has a larger capacity than the internal memory 17 in order to provide sufficient timing to transfer CD-ROM data to the host computer.

Figure 5:
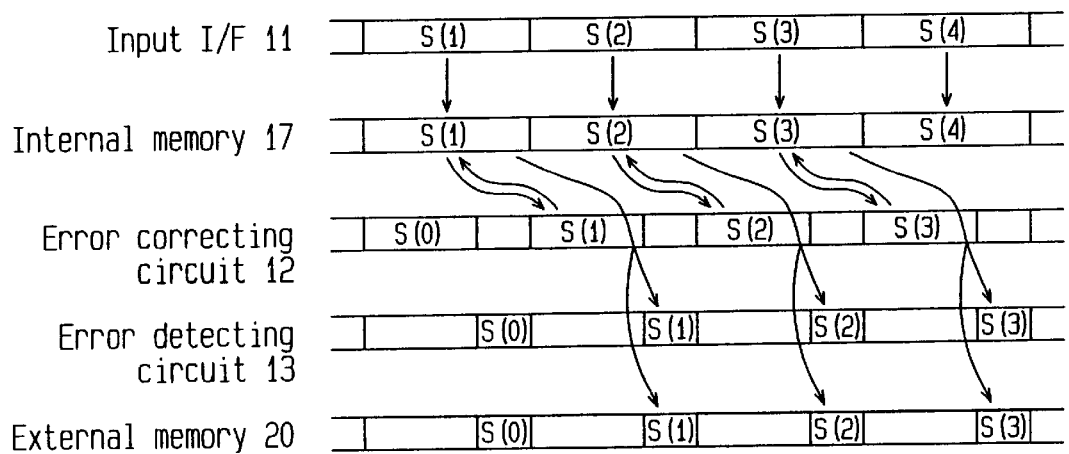
FIG. 5 is a timing chart of the flow of CD-ROM data processed by the apparatus in FIG. 4.

The operation of the code error correcting and detecting apparatus will now be described with reference to FIG. 5. The internal memory controller 15 receives data S(n) block by block from the input interface 11, and writes the data S(n) in the internal memory 17. In parallel to reception of the next data S(n+1), the internal memory controller 15 transfers the previous data S(n), written in the internal memory 17, to the error correcting circuit 12. The data S(n), when containing an error which has been generated by the error correcting process, is rewritten with the correct data in the internal memory 17. The error corrected data S(n) is transferred to the error detecting circuit 13 from the internal memory 17 by the internal memory controller 15, and is simultaneously written in the principal memory 20 by the second memory controller 16. The transfer of the data S(n) to the error correcting circuit 12 and the error detecting circuit 13 is completed within a period (one block period) from the point of supply of the previous data S(n) to the point of supply of the next data S(n+1). In response to a request from the host computer, the second memory controller 16 transfers the data S(n) stored in the principal memory 20 to the output interface 14.

As explained above, access to the internal memory 17 is allocated to access for writing data from the input interface 11 and access for reading out data to the error correcting circuit 12 or the error detecting circuit 13 in a time-divisional manner. Further, access to the principal memory 20 is likewise allocated to access for writing data from the internal memory controller 15 and access for reading out data to the output interface 14 in a time-divisional manner. This increases the degree of freedom to set the timing for reading data from the principal memory 20 at the time CD-ROM data is transferred to the host computer, resulting in an increased transfer rate for CD-ROM data.

FIG. 7 presents a schematic block diagram of an address generating circuit 200 which supplies write and read address signals to the internal memory 17 or the principal memory 20. The address generating circuit 200 has a first address generator 21, a second address generator 22, two latches 23 and an adder 24. The address generating circuit 200 is independently provided for each of the internal memory 17 and the principal memory 20.

Figure 8:
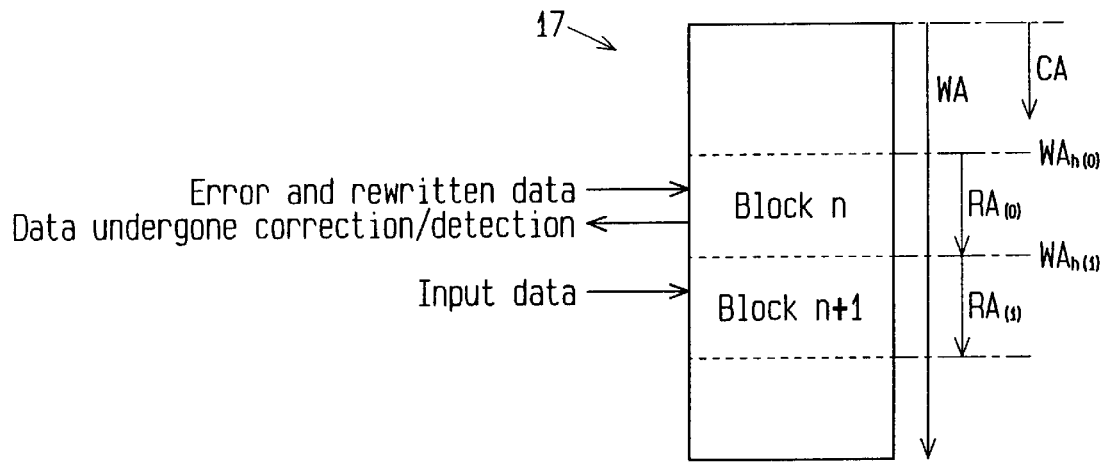
FIG. 8 is a diagram exemplifying access to a temporary memory in the apparatus in FIG. 4.
Figure 9:
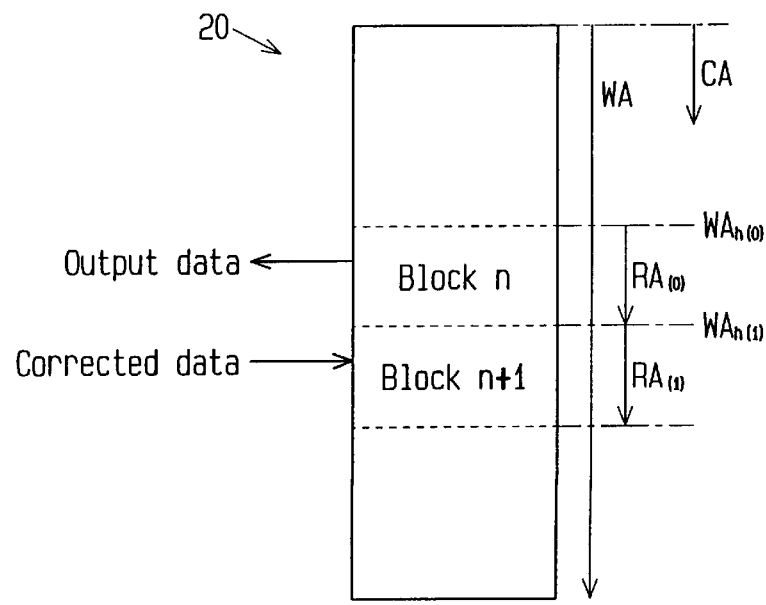
FIG. 9 is a diagram exemplifying access to a principal memory in the apparatus in FIG. 4.

As shown in FIGS. 8 and 9, the first address generator 21 includes a counter for generating a write address signal WA to the internal memory 17 or the principal memory 20. The write address signal WA designates the entire memory area from address 0 to the last address in a predetermined order. The write address signal WA is generated in such a way that after the address position reaches the last address, the address position returns to address 0 so that the addresses are repeatedly designated in the same order. Accordingly, CD-ROM data is sequentially written in the internal memory 17 in accordance with the order of data input to the input interface 11, and CD-ROM data is sequentially written in the principal memory 20 in accordance with the order of data reading from the internal memory 17.

The second address generator 22 generates a circulation address signal CA which designates partial areas corresponding to one block of CD-ROM data in the internal memory 17 and the principal memory 20 in a specific order which is determined process by process. For example, the circulation address signal CA is generated in such a manner that one block of data is read every 24 pieces of data from the internal memory 17 in accordance with the P sequence of P code words and one block of data is read every 43 pieces of data from the internal memory 17 in accordance with the Q sequence of Q code words. With regard to the principal memory 20, the circulation address signal CA is generated in such a way that one block of data is read in the same order as that for the write address signal.

The latches 23 in FIG. 7, connected to the first address generator 21, latch address information WAh which includes the head data of each block in the write address signal WA. The first stage of latch 23 retains the head address information WAh(0) of the currently input block, and the second stage of latch 23 retains the head address information WAh(1) of the block which has been input one block earlier and is currently undergoing error correction. That is, the head address information WAh that is latched by the first stage of latch 23 is shifted to the second stage of latch 23 after processing one block is completed.

The adder 24, connected to the second address generator 22 and the second stage of latch 23, adds the head address information WAh to the circulation address signal CA from the second address generator 22 to generate an actual read address signal RA. The circulation address signal CA whose head address is address 0 designates the memory area corresponding to one block. Adding the head address information WAh to the circulation address signal CA can therefore permit access to the entire memory area where one block of data is stored.

For example, the circulation address signal CA is added to the head address information WAh(0) in the internal memory 17 where CD-ROM data of block n is stored, as shown in FIG. 8. This yields a read address signal RA(0) which specifies the whole area where CD-ROM data of block n is stored. In accordance with this read address signal RA(0), one block of CD-ROM data is transferred from the internal memory 17 to the error correcting circuit 12 or the error detecting circuit 13.

Further, the circulation address signal CA is added to the head address information WAh(0) in the principal memory 20 where CD-ROM data of block n is stored, as shown in FIG. 9. This yields a read address signal RA(0) which specifies the whole area where CD-ROM data of block n is stored. In accordance with this read address signal RA(0), one block of CD-ROM data is transferred from the principal memory 20 to the output interface 14.

The address generating circuit 200 selectively supplies the write address signal WA and the read address signal RA to the internal memory 17 and the principal memory 20. The input interface 11, the error correcting circuit 12 and the error detecting circuit 13, which operate in parallel, gains access to the internal memory 17 or the principal memory 20 block by block in a time-divisional manner. Since the operation timing of the second memory controller 16 is not directly related to the operation timings of the input interface 11 and the error correcting circuit 12 at this time, the second memory controller 16 can execute inputting and outputting of CD-ROM data to and from the principal memory 20 at any timing. It is therefore possible to transfer CD-ROM data to the host computer without waiting for an operational interval of the input interface 11 or the error correcting circuit 12.

Because the error detecting circuit 13 and the host computer do not need an ECC, one block of CD-ROM data excluding the ECC may be read from the internal memory 17 and written in the principal memory 20. In this case, the amount of data to be stored in the principal memory 20 is reduced.

Figure 10:
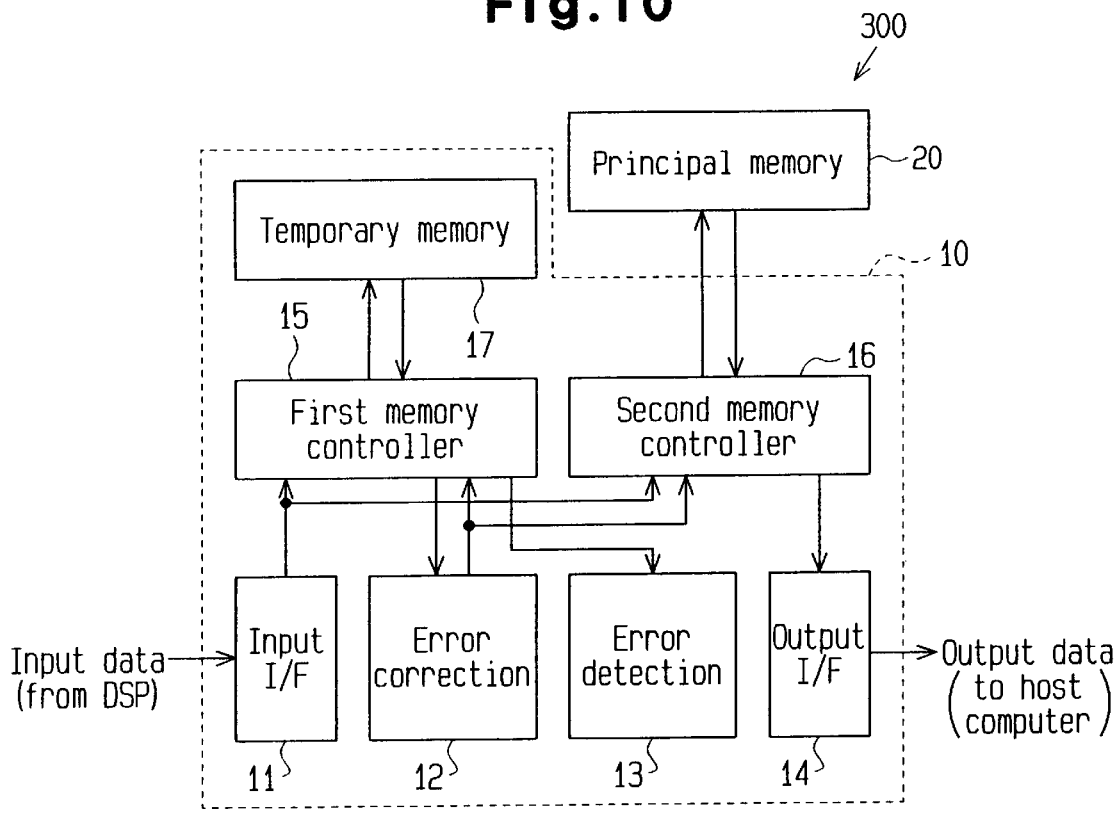
FIG. 10 is a schematic block diagram of a code error correcting and detecting apparatus according to a second embodiment of the present invention.

FIG. 10 is a schematic block diagram of a code error correcting and detecting apparatus 300 according to a second embodiment of this invention. To avoid redundant description, like or same reference numerals are given to those components which are the same as the corresponding components of the first embodiment.

The input interface 11 receives CD-ROM data from the digital signal processor and supplies the CD-ROM data to the internal memory controller 15 and the second memory controller 16.

The second memory controller 16 controls writing of CD-ROM data from the input interface 11 into the principal memory 20 and reading of CD-ROM data from the principal memory 20 to the output interface 14. Based on the result of correction by the error correcting circuit 12, the second memory controller 16 rewrites part of the CD-ROM data that has been stored in the principal memory 20. Error rewriting on the CD-ROM data stored in the principal memory 20 and error rewriting on the CD-ROM data stored in the internal memory 17 are carried out substantially simultaneously.

Figure 11:
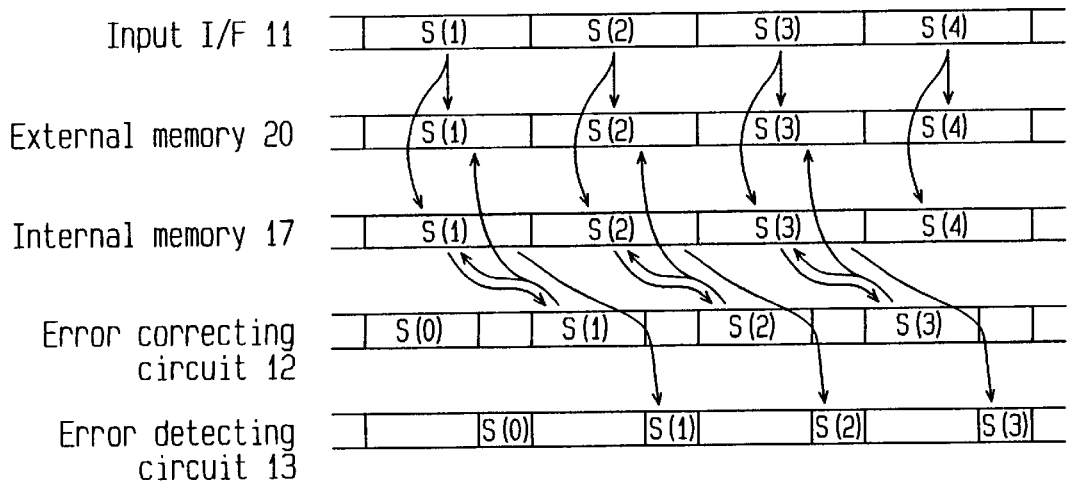
FIG. 11 is a timing chart showing the flow of CD-ROM data processed by the apparatus in FIG. 10.

The operation of the code error correcting and detecting apparatus 300 will be discussed below with reference to FIG. 11. The internal memory controller 15 and the second memory controller 16 receive data S(n) from the input interface 11 block by block, and write the data S(n) in the associated internal memory 17 and the principal memory 20. When an error is produced in the error correcting process, error data stored in the internal and external memories 17 and 20 are rewritten with correct data.

According to the second embodiment, access to the principal memory 20 is allocated to access for writing data from the input interface 11, access for writing corrected data from the error correcting circuit 12, and access for reading data from the output interface 14. While data is transferred to the error correcting circuit 12 or the error detecting circuit 13 from the internal memory 17 for error correction or error detection, access to the principal memory 20 is inhibited. After error correction is completed, CD-ROM data is transferred to the output interface 14 from the principal memory 20. This allows a sufficient time to transfer CD-ROM data to the output interface 14 from the principal memory 20.

Further, because the operation timing of the second memory controller 16 is not directly related to the read operation timings of the error correcting circuit 12 and the error detecting circuit 13, the second memory controller 16 can access the principal memory 20 for inputting and outputting of CD-ROM data at any timing. It is therefore possible to transfer CD-ROM data to the host computer without waiting for an operational interval of the error correcting circuit 12 and the error detecting circuit 13.

It should be apparent to those skilled in the art that the present invention may be embodied in many other specific forms without departing from the spirit or scope of the invention. Particularly, it should be understood that the invention may be embodied in the following forms. This invention may be adapted to a system which uses a recording medium like a DVD (Digital Video Disc) besides a CD-ROM system.

Therefore, the present examples and embodiments are to be considered as illustrative and not restrictive and the invention is not to be limited to the details given herein, but may be modified within the scope and equivalence of the appended claims.

What is claimed is:

1. A code error correcting and detecting apparatus for performing error correction and error detection on plural blocks of digital data using an error correction code and an error detection code to generate processed digital data, comprising:

an input interface for fetching digital data in a block by block manner;

a temporary memory for storing said fetched digital data in a block by block manner;

a correcting circuit for performing error correction on digital data read from said temporary memory in a block by block manner using said error correction code and rewriting erroneous digital data to said temporary memory with error corrected digital data;

a detecting circuit for performing error detection on the error corrected digital data and supplied from said temporary memory in a block by block manner using said error detection code, and setting an error flag based on a detection result;

a principal memory for storing, in a block by block manner, said error corrected digital data supplied to said detecting circuit from said temporary memory; and an output interface for transferring said error corrected digital data stored in said principal memory to an external unit.

2. The code error correcting and detecting apparatus according to claim 1, further comprising:

a first memory controller, connected between said temporary memory and each of said input interface, said correcting circuit and said detecting circuit, for controlling writing of the digital data to said temporary memory from one of said input interface and said correcting circuit, and transfer of the digital data to one of said correcting circuit and said detecting circuit from said temporary memory; and a second memory controller, connected between said principal memory and said temporary memory controller and said output interface, for controlling writing of the digital data to said principal memory from said temporary memory controller and transfer of the digital data to said output interface from said principal memory.

3. The code error correcting and detecting apparatus according to claim 2, wherein said temporary memory has a capacity large enough to store at least two blocks of digital data.

4. A code error correcting and detecting apparatus for performing error correction and error detection on plural blocks of digital data using an error correction code and an error detection code to generate processed digital data, comprising:

an input interface for fetching digital data in a block by block manner;

a temporary memory for storing said fetched digital data in a block by block manner;

a principal memory for storing digital data in a block by block manner together with said temporary memory;

a correcting circuit for performing error correction on digital data read from said temporary memory in a block by block manner using said error correction code and rewriting erroneous digital data to said temporary memory and said principal memory with error corrected digital data;

a detecting circuit for performing error detection on the error corrected digital data supplied from said temporary memory in a block by block manner using said error detection code, and setting an error flag based on a detection result; and an output interface for transferring said error corrected digital data stored in said principal memory to an external unit.

5. The code error correcting and detecting apparatus according to claim 4, further comprising:

a first memory controller, connected between said temporary memory and each of said input interface, said correcting circuit and said detecting circuit, for controlling writing of the digital data to said temporary memory from one of said input interface and said correcting circuit, and transfer of the digital data to one of said correcting circuit and said detecting circuit from said temporary memory; and a second memory controller, connected between said principal memory and said input interface, said correcting circuit and said output interface, for controlling writing of the digital data to said principal memory from one of said input interface and said correcting circuit and transfer of the digital data to said output interface from said principal memory.

6. The code error correcting and detecting apparatus according to claim 5, wherein said temporary memory has a capacity large enough to store at least two blocks of digital data.

7. A decoder, connected to a principal memory which stores digital data, for performing error correction and error detection on plural blocks of the digital data using an error correction code and an error detection code to generate processed digital data, comprising:

an input interface for fetching digital data in a block by block manner;

a temporary memory for storing said fetched digital data in a block by block manner;

a correcting circuit for performing error correction on digital data read from said temporary memory in a block by block manner using said error correction code and rewriting erroneous digital data to said temporary memory with error corrected digital data;

a detecting circuit for performing error detection on the error corrected digital data and supplied from said temporary memory in a block by block manner using said error detection code, and setting an error flag based on a detection result; and an output interface for transferring said error corrected digital data stored in said principal memory to an external unit, wherein said error corrected digital data stored in said temporary memory is supplied to said principal memory.

8. The decoder according to claim 7, further comprising:

a first memory controller, connected between said temporary memory and each of said input interface, said correcting circuit and said detecting circuit, for controlling writing of the digital data to said temporary memory from one of said input interface and said correcting circuit, and transfer of the digital data to one of said correcting circuit and said detecting circuit from said temporary memory; and a second memory controller, connected between said principal memory and said temporary memory controller and said output interface, for controlling writing of the digital data to said principal memory from said temporary memory controller and transfer of the digital data to said output interface from said principal memory.

9. A decoder, connected to a principal memory which stores digital data, for performing error correction and error detection on plural blocks of the digital data using an error correction code and an error detection code to generate processed digital data, comprising:

an input interface for fetching digital data in a block by block manner;

a temporary memory for storing said fetched digital data in a block by block manner;

a correcting circuit for performing error correction on digital data read from said temporary memory in a block by block manner using said error correction code and rewriting erroneous digital data to said temporary memory and said principal memory with error corrected digital data;

a detecting circuit for performing error detection on the error corrected digital data supplied from said temporary memory in a block by block manner using said error detection code, and setting an error flag based on a detection result; and an output interface for transferring said error corrected digital data stored in said principal memory to an external unit, wherein said fetched digital data is stored in said principal memory in a block by block manner as said temporary memory.

10. The decoder according to claim 9, further comprising:

a first memory controller, connected between said temporary memory and each of said input interface, said correcting circuit and said detecting circuit, for controlling writing of the digital data to said temporary memory from one of said input interface and said correcting circuit, and transfer of the digital data to one of said correcting circuit and said detecting circuit from said temporary memory; and a second memory controller, connected between said principal memory and said input interface, said correcting circuit and said output interface, for controlling writing of the digital data to said principal memory from one of said input interface and said correcting circuit and transfer of the digital data to said output interface from said principal memory.

* * * * *